United States Patent [19]

Morris et al.

[11] Patent Number: 4,713,820
[45] Date of Patent: Dec. 15, 1987

[54] THERMAL LENSING-COMPENSATED LANTHANUM BERYLLATE LASER

[75] Inventors: Robert C. Morris, Ledgewood; Margaret N. Long, Landing; Timothy C. Chin, Piscataway; Donald F. Heller, Bound Brook, all of N.J.

[73] Assignee: Allied Corporation, Morris Township, N.J.

[21] Appl. No.: 762,100

[22] Filed: Aug. 2, 1985

[51] Int. Cl.$^4$ .......................... H01S 3/16; C09K 11/06
[52] U.S. Cl. ........................................ 372/41; 252/301.8
[58] Field of Search ...................... 252/301.18, 301.4; 372/41, 44, 45

[56] References Cited

U.S. PATENT DOCUMENTS

| | | | |
|---|---|---|---|
| 3,866,142 | 2/1975 | Cline et al. | 372/41 |
| 3,983,051 | 9/1976 | Cline et al. | 372/4 |
| 4,110,702 | 8/1978 | Chicklis | 372/41 |
| 4,272,733 | 6/1981 | Walling et al. | 372/41 |

OTHER PUBLICATIONS

Journal of Applied Physics, Spectroscopic Properties and Laser Performance of ND3+ in Lanthanum Beryllate, H. P. Jenssen, R. F. Begley, R. Webb, & R. C. Morris.
1984 American Institute of Physics, Stability of the Temporal and Energy Characteristics of a Picosecond Lanthanum Beryllate Laser, A. Piskarskas, V. Sirutkaitis, A. Yuozapavichyus, & A. Yankauskas.
IEEE Journal of Quantum Electronics, Reduced Thermal Focusing and Birefringence in Zig-Zag Slab Geometry Crystalline Lasers, T. J. Kane, R. C. Eckardt, & R. L. Byer.
Waveplate for Correcting Thermally Induced Stress Birefringence in Solid State Lasers, Eric A. Lundstrom.
Applied Physics Letters, Lanthanum Beryllate: A New Rare-Earth Ion Laser Host, R. C. Morris, C. F. Cline, R. F. Begley, M. Dutoit, P. J. Harget, H. P. Jenssen, T. S. LaFrance, & R. Webb.
Repetitively Q-Switched Nd:BeL Lasers, (pp. 81, 91, 120).

Primary Examiner—Gene Wan
Attorney, Agent, or Firm—Anibal Jose Cortina; Gerhard H. Fuchs

[57] ABSTRACT

A single crystal of rare-earth-doped lanthanum beryllate, whose crystal orientation is suitably chosen, provides a laser medium whose index of refraction is substantially independent of temperature. A laser using such a crystal as the laser medium displays little or no thermal lensing, thus permitting high power operation without wavefront distortion.

11 Claims, 5 Drawing Figures

THERMAL LENSING-COMPENSATED LANTHANUM BERYLLATE LASER

BACKGROUND OF THE INVENTION

1. Field of the Invention

This invention relates to a lanthanum beryllate laser that exhibits reduced thermal lensing, because its laser medium is cut with one of a certain family of crystal orientations.

2. Description of the Prior Art

A number of solids, both crystals and glasses, have been found to be suitable for laser action since the first (solid-state) laser was demonstrated by Maiman in 1960. Generally, the laser-active materials involve a rare earth, actinide, or transition metal dopant in a crystalline or glass host. An extensive treatment of then-known solid-state lasers was published in 1976-*Solid-State Laser Engineering*, W. Koechner, Springer-Verlag, New York. More recently, a compilation of laser crystals was presented in *Laser Crystals*, A. A. Kaminskii, Springer-Verlag, New York (1981). (See also P. Moulton, Laser Focus, May 1983, pp. 83 ff)

Among solid-state laser host materials is lanthanum beryllate (BEL), which was disclosed in U.S. Pat. Nos. 3,866,142, issued Feb. 11, 1975 and 3,983,051, issued Sept. 28, 1976. The specific laser materials disclosed in those patents are described by the formula $Be_2La_{2-2x}Z_{2x}O_5$, where Z is a dopant selected from the group consisting of praseodymium, neodymium, samarium, europium, gadolinium, terbium, dysprosium, holmium, erbium, thulium, ytterbium, and mixtures thereof and where x is a positive value not greater than about 0.2. Nd:BEL is a preferred composition.

BEL crystallizes in the monoclinic system (space group C2/c) with a structure based on a three dimensional framework of corner sharing $BeO_4$ tetrahedra. The interstices of the framework form $La_{3+}$ sites (point group C1). The structure bears some resemblance to the coesite form quartz and to the feldspars, which are $SiO_4$ framework structures, but differs in that each tetrahedron in BEL has one unshared corner. The lattice constants are $a_O=0.753$ nm, $b_O=0.734$ nm, and $c_O=0.744$ nm; b is the two-fold rotation axis and the angle between the a and c axes is 91°33'. As a consequence of the monoclinic structure, BEL is optically biaxial.

The relationship between the mutually orthogonal principal vibration directions, X, Y, and Z, and the crystallographic directions a, b, and c, is shown in FIG. 1. The optical vibration direction Y coincides with the crystallographic 2-fold rotation axis b. The optical X and Z directions lie in the crystallographic a-c plane. In this plane c and Z are related by $\theta=31.7°$ at $\lambda=1$ μm. The refractive indices at $\lambda=1.00$ μm are 1.964, $\beta=1.997$ and $\gamma=2.035$ X-, Y-, and Z-polarized light, respectively.

Optical pumping of a laser rod leads to a substantially radial thermal gradient in the rod, which in turn gives rise to "thermal lensing". (See Koechner op. cit., pp. 352 ff) Thermal lensing is a distortion of the laser beam that results from three separate contributions: thermal expansion causes elastic distortion of the laser rod, resulting in the formation of a lens. The stress optic lens results from the change in refractive index with thermally-induced stresses. The third contribution, which is by far the largest of the three in BEL, is the temperature dependence of the refractive index, dn/dT. This is the contribution that is primarily addressed by this invention.

An analysis of the thermal and mechanical properties of Nd:BEL, as they relate to its use as a laser medium, was described in a report "Repetitively Q-switched Nd:BeL Lasers," prepared for Goddard Space Flight Center by the Aerospace Corporation. The report describes the techniques by which the authors measured the coefficient of linear thermal expansion and the temperature dependence of the refractive index, dn/dT. In addition to reporting the results, the report suggests that thermal lensing in Nd:BEL could be eliminated by choosing a geometric aspect ratio (rod diameter/rod length) of 0.625, for which the lens induced by positive thermal expansion cancels the lens induced by negative dn/dT. That aspect ratio is six times that for a "typical laser rod," and such a large aspect ratio is not desirable for a laser rod. It is hard to pump efficiently and has a low gain, because of the relatively short path of the beam in traversing the crystal. Furthermore, for that rod to be athermal it must be pumped along its entire length, which makes mounting difficult.

Another laser material of interest is holmium doped lithium yttrium fluoride, which was disclosed in U.S. Pat. No. 4,110,702, issued Aug. 29, 1978.

In an effort to minimize thermal distortion of laser beams, rectangular cross-section slabs have been used in place of cylindrical laser rods. A rectangular slab provides a larger cooling surface and can yield a one-dimensional temperature gradient across its thickness. If, in addition, the laser beam is made to pass through the slab in zig-zag fashion (by total internal reflection), optical distortion is minimized, because each ray in the beam passes through the same refractive index variation, and there is, thus, minimal wavefront distortion. The zig-zag slab can generally be used with any solid-state laser medium; however, the zig-zag slab laser requires that the opposing faces be optically polished, flat and parallel to optical wavelength tolerances, and not in contact with anything, such as a support, that would interfere with the total internal reflection.

SUMMARY OF THE INVENTION

In accordance with the present invention, a lanthanum beryllate (BEL) single crystal is provided that (a) is doped with an element selected from the group consisting of praseodymium, neodymium, samarium, europium, gadolinium, terbium, dysprosium, holmium, erbium, thulium, ytterbium and mixtures thereof; and (b) has an elongated shape, in which the long direction is oriented at such an angle with respect to the crystallographic axes of the crystal that a plane polarized wave propagating in the crystal in the long direction will have substantially zero temperature dependence of refractive index. The invention also provides a laser that incorporates such a single crystal as the laser medium. The laser also generally includes means for exciting the laser medium to emit a beam of coherent radiation, mirrors forming an optical resonator for maintaining laser oscillations between the mirrors and, optionally, a polarizer for plane-polarizing the laser beam. A laser that incorporates a BEL crystal having that crystallographic orientation exhibits reduced thermal lensing and, consequently, reduced beam distortion. Preferably, the crystal has a circular or rectangular cross section.

An elongated rare earth-doped lithium yttrium fluoride crystal can be oriented for minimal temperature dependence of refractive index and can be incorporated into a laser that displays reduced thermal lensing.

When using the term "elongated" to refer to the crystals of the present invention, we mean those having a geometrical aspect ratio less than one half (length at least twice the diameter).

DETAILED DESCRIPTION OF THE INVENTION

This invention provides a solution to the problem of laser beam distortion caused by thermal lensing in solid-state laser crystals. The solution is based on the fact that suitably oriented BEL has substantially zero temperature dependence of refractive index, dn/dT, for light having its electric vector (polarization) parallel to certain crystallographic directions (athermal polarizations). Consequently, even if there is a temperature gradient in the laser medium, there will be constant index of refraction for plane-polarized light having that polarization. As a result, there is no wavefront distortion of the kind that would otherwise be caused by a laser beam comprising rays that pass through regions of different temperature. The laser medium has a long dimension substantially parallel to the propagation direction of athermally polarized waves. The medium may be generally cylindrical, with the long dimension parallel to the cylinder axis. If the laser medium is a rectangular cross-section slab, cooled through the large slab faces, then the temperature gradient is substantially in the direction normal to those faces and minimal or zero thermally-induced variation of index of refraction can be achieved by orienting the BEL crystal so that the temperature gradient is normal to the direction along which the crystal has its maximum dn/dT.

Although various methods can be used to prepare BEL crystals, the Czochralski method is preferred. Details of the growth of BEL crystals appear in U.S. Pat. No. 3,983,051.

Figure 1:
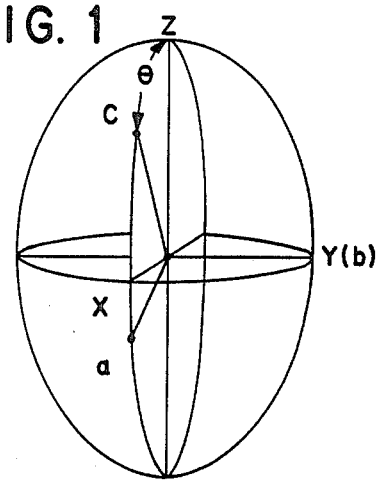
FIG. 1 shows the orientation of the indicatrix axes in relation to the crystallographic axes of BEL.

In order to grow a crystal that is suitable for practicing the present invention, a seed crystal must have one of the proper crystallographic orientations. The procedure for choosing a proper orientation may be understood by first referring to FIG. 1, which shows X, Y and Z, the optical indicatrix axes (or "principal vibration directions") of BEL relative to a, b, and c, its crystallographic axes. Note that indicatrix axis Y is collinear with crystallographic axis b, while the other indicatrix and crystallographic axes do not coincide. The index of refraction and its temperature dependence measured at 1150 nm appear in Table 1 for polarizations of the electric vector, E, parallel to each of the indicatrix axes.

TABLE 1

| Polarization | Refractive Index (n) | Temperature Dependence (dn/dT)* |
|---|---|---|
| E parallel to X | $\alpha = 1.9623$ | $2.86 \times 10^{-6}/°C.$ |
| E parallel to Y | $\beta = 1.9955$ | $1.52 \times 10^{-6}/°C.$ |
| E parallel to Z | $\gamma = 2.0327$ | $-6.0 \times 10^{-6}/°C.$ |

*Note that these results do not agree with those determined earlier by the Aerospace Corp.

Figure 2:
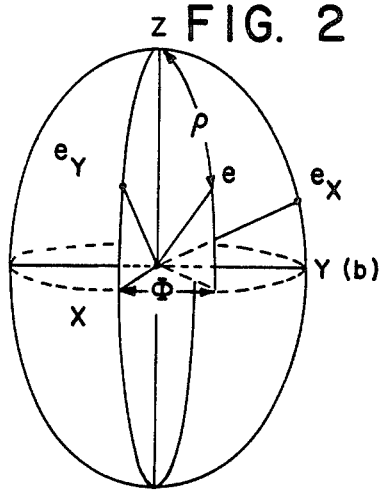
FIG. 2 shows the direction for which the index of refraction is independent of temperature.

Since dn/dT is negative for E parallel to the Z axis and positive for E parallel to the X and Y axes, there is a direction for E in the XZ plane and in the YZ plane for which dn/dT is zero. These directions are shown schematically in FIG. 2 by the vectors $e_x$ and $e_y$, whose magnitudes represent the value of the refractive index for light polarized in these directions, respectively. Note that there is a locus of vectors, e, lying in the octant above the XY plane, between the XZ and YZ planes, that represent the polarization directions for which the temperature coefficient is zero. The direction of e is shown in FIG. 2 in terms of the polar coordinate angles $\rho$ and $\phi$. Likewise, there are loci of vectors, e, in the other three octants above the XY plane as well as the four octants below the XY plane. Due to the crystallographic asymmetry, these octants are not all equivalent, and a larger region, such as that described by $\Phi=0-180°$ or $\rho=0-90°$, is required for a complete description of the physical properties. The angle $\rho$ between the vector e and the Z axis may be calculated as follows:

For a biaxial crystal such as BEL, the refractive index, n, as a function of the polarization direction is given by $$(1) \quad n = (\sin^2\rho\cos^2\phi\alpha^{-2} + \sin^2\phi\beta^{-2} + \cos^2\rho\gamma^{-2})^{-\frac{1}{2}}$$

where $\rho$ and $\phi$ are the azimuthal and polar angles, respectively, of the electric field vector, as shown in FIG. 2, and $\alpha$, $\beta$, and $\gamma$ are indices of refraction for E polarized parallel to the X, Y, and Z axis, respectively. Differentiating (1) with respect to temperature yields $$\frac{dn}{dT} = (\sin^2\rho\cos^2\phi\alpha^{-2} + \sin^2\rho\sin^2\phi\beta^{-2} + \cos^2\rho\gamma^{-2})^{-3/2} \quad (2)$$

$$-\left(\sin^2\rho\cos^2\phi\alpha^{-3}\frac{d\alpha}{dT} + \sin^2\rho\sin^2\phi\beta^{-3}\frac{d\beta}{dT} + \cos^2\rho\gamma^{-3}\frac{d\gamma}{dT}\right) \text{ for } \frac{dn}{dT} = 0$$

$$(3)$$

$$-\sin^2\rho\left(\cos^2\phi\alpha^{-3}\frac{d\alpha}{dT} + \sin^2\phi\beta^{-3}\frac{d\beta}{dT}\right) = \cos^2\rho\gamma^{-3}\frac{d\gamma}{dT}$$

$$(4)$$

$$\tan^2\rho = -\gamma^{-3}\frac{d\gamma}{dT} \bigg/ \left(\cos^2\phi\alpha^{-3}\frac{d\alpha}{dT} + \sin^2\phi\beta^{-3}\frac{d\beta}{dT}\right)$$

Substituting the measured values of refractive index from Table 1 into 4), we get $$(5) \quad \tan^2\rho = 0.7144/(0.3785 \cos^2\rho + 0.1913 \sin^2 \quad )^{\frac{1}{2}}$$

Values of $\rho$ for selected values of $\phi$ are tabulated in

TABLE 2

| Φ | ρ |
|---|---|
| 0° (XZ plane) | Z-53.9°-X |
| 10 or 170 | 54.15 |
| 20 or 160 | 54.76 |

TABLE 2-continued

| Φ | ρ |
|---|---|
| 30 or 150 | 55.72 |
| 40 or 140 | 57.01 |
| 50 or 130 | 58.48 |
| 60 or 120 | 60.00 |
| 70 or 110 | 61.35 |
| 80 or 100 | 62.30 |
| 90 (YZ plane) | Z-62.64°-Y |

It should be noted that the refractive indices and their temperature dependences vary slightly with both wavelength and temperature and that the exact temperature compensated cuts may vary slightly from those calculated. Generally, orientations near those given in Table 2 will provide substantially reduced thermal In order to determine a rod cut (i.e., axial direction) in an optically biaxial crystal associated with a given polarization direction (e.g., the zero dn/dT polarization e in BEL), the following graphical procedure can be used. It is derived from the Biot-Fresnel Rule.

Figure 3:
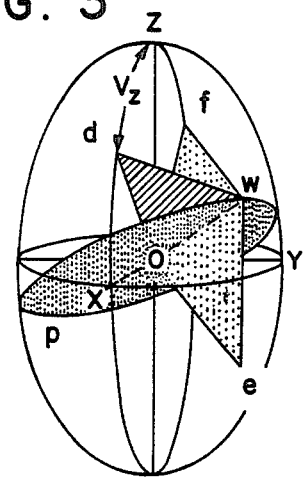
FIG. 3 assists derivation of the preferred direction for the laser rod axis.

Referring to FIG. 3, the optic axes, d and f, are located on the refractive index ellipsoid (indicatrix) in the XZ plane. The angle between d and the Z-axis, $V_z$, can be calculated from:

$$\cos V_z = \frac{\alpha}{\beta} \frac{(\gamma + \beta)(\gamma - \beta)}{(\gamma + \alpha)(\gamma - \alpha)}$$

The plane normal to o-e is then drawn, intersecting the ellipsoid at a series of points p. The radii o-p satisfy one condition for the wave normal, i.e., that they are all perpendicular to o-e, the electric polarization direction. The desired wave normal is then the radius o-w lying in this plane that satisfies the further condition that the plane o-w-e bisects the solid angle formed by the planes o-w-d and o-w-f, the Biot-Fresnel Rule. One possible orientation of the face of the desired laser rod is then the plane normal to o-w; then e will be a privileged vibration direction in the crystal for light normally incident on this face. Since e will, in general, correspond to an extraordinary ray path in the crystal, the ray axis will not correspond exactly to o-w. In some cases o-w will be a sufficient approximation to the rod axis since the beam walk-off can be compensated by slightly off normal incidence on the rod face, without changing the polarization direction too far from e (i.e., the new dn/dT values will still be near zero).

Figure 4:
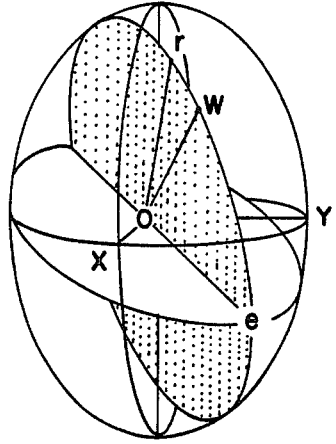
FIG. 4 shows the ray path associated with the thermally-compensated polarization direction.

If it is desired to have the rod axis exactly parallel to the extraordinary ray path associated with e, the following procedure is used (FIG. 4). The plane o-w-e is extended to its intersection with the indicatrix; in general the intersection is an ellipse. The ray path associated with polarization e and wave normal w is then o-r, the conjugate radius to o-e in this ellipse. The conjugate radius is the radius that is parallel to the line that is tangent to the ellipse at point e.

The laser rod obtained by this orientation procedure will have faces that are not exactly perpendicular to its longitudinal axis. It is designed such that e-polarized light will travel parallel to the rod axis inside the rod and perpendicular to the rod faces, i.e., parallel to o-w, outside the rod. Thus, the mirrors defining the laser resonator should be aligned substantially parallel to the rod faces.

It is not always necessary, or even desirable, to reduce dn/dT to exactly zero. First, a residual non-zero dn/dT can be balanced by a stress optic effect of the opposite sign to yield zero thermal lensing. Second, it is sometimes desirable to have a small amount of thermal lensing to stabilize or to destabilize the laser cavity, as desired. In any case, since the rate of Czochralski growth of BEL is not strongly dependent on seed orientation, a laser crystal can be grown readily from a seed crystal having the desired orientation.

A variety of rare earth dopants is suitable for the present invention. The preferred range of dopant concentraion is about 0.1-10 atomic percent rare earth substitution for La sites. Nd-doping provides the most efficient lasing and is, for that reason, preferred.

The characteristic that permits thermal lensing compensation in BEL is positive dn/dT in one polarization direction and negative dn/dT in another (see Table 1). The same situation characterizes $LiYF_4$. Thus, a similar analysis, using measured values of dn/dT for the various polarization directions, yields the desired orientations for rare earth-doped $LiYF_4$ crystals that provide lasers having substantially reduced thermal lensing.

Figure 5:
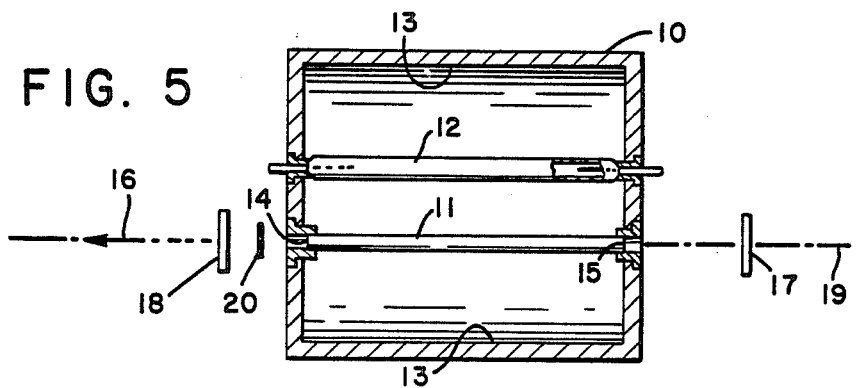
FIG. 5 is a schematic of a laser of the present invention.

FIG. 5 illustrates a laser apparatus of this invention. The laser medium 11, comprising a laser crystal and an optical pumping source 12, are housed in a pumping chamber 10, which has a highly reflective inner surface 13, which defines a reflective cavity. Reflection at surface 13 may be diffuse or specular. Laser medium 11 is normally provided with coated ends 14 and 15 having a conventional dielectric anti-reflection coating. Completely reflecting mirror 17, optional polarizer 20, and partially reflecting mirror 18 are positioned external to chamber 10 along cylindrical axis 19 of laser medium 11. Lasing action is evidenced by emission of highly collimated coherent radiation 16, emanating from partially reflecting mirror 18. Mirrors 17 and 18 may both be partially reflecting. If necessary to maintain the desired operating temperature, laser medium 11 and pumping source 12 may be cooled by a fluid circulated through chamber 10.

We claim:
1. A lanthanum beryllate single crystal that
   (a) is doped with an element selected from the group consisting of praseodymium, neodymium, samarium, europium, gadolinium, terbium, dysprosium, holmium, erbium, thulium, ytterbium and mixtures thereof; and
   (b) has an elongated shape, in which the long direction is oriented at such an angle with respect to the crystallographic axes of the crystal that a plane polarized wave propagating in the crystal in the long direction will have substantially zero temperature dependence of refractive index.

2. The crystal of claim 1 in which the dopant comprises 0.1-10 atomic percent substitution for lanthanum sites.

3. The crystal of claim 1 in which the dopant is neodymium.

4. The crystal of claim 1 having a generally cylindrical shape, with the cylinder axis substantially along the long direction.

5. The crystal of claim 1 having the shape of an elongated slab with a substantially rectangular cross-section.

6. A laser that comprising:
   (a) a laser medium comprising a lanthanum beryllate single crystal that;
      (i) is doped with an element selected from the group consisting of praseodynium, neodymium, samarium, europium, gadolinium, terbium, dysprosium, holmium, erbium, thulbium, ytterbium and mixtures thereof, and (ii) has an elongate shape, in which the long direction is oriented at such an angle with respect to the crystallographic axes of the crystal that a plane polarized wave propagating in the crystal in the long direction will have substantially zero temperature dependence of refractive index;

(b) means for exciting the laser medium to emit a beam of coherent radiation; and (c) mirrors forming an optical resonator for maintaining laser oscillatios between the mirrors.

7. The laser of claim 6 further comprising a polarizer in the beam path.

8. The laser of claim 6 in which the laser medium has the shape of an elongated slab with a substantially rectangular cross-section.

9. The laser of claim 8 further comprising cooling means for providing a temperature gradient only in a direction in the slab that is normal to the direction along which exists the maximum temperature dependence of refractive index.

10. A lithium yttrium fluoride single crystal that
(a) is doped with an element selected from the group consisting of praseodymium, neodymium, samarium, terbium, dysprosium, holmium, europium, gadolinium erbium, thulium, ytterbium and mixtures thereof; and (b) has an elongated shape, in which the long direction is oriented at such an angle with respect to the crystallographic axes of the crystal that a plane polarized wave propagating in the crystal in the long direction will have substantially zero temperature dependence of refractive index.

11. A laser that comprising:
(a) a closer medium comprising a lithium ytrium fluoride single crystal that;
 (i) is doped with an element selected from the group consisting of praseodymium, neodymium, samarium, europium, gadolinium, terbium, dysprosium, holmium, erbium, thulium, ytterbium and mixtures thereof,
 (ii) has an elongated shape, in which the long direction is oriented at such an angle with respect to the crystallographic axes of the crystal that a plane polarized wave propagating in the crystal in the long direction will have substantially zero temperature dependence of refractive index;

(b) means for exciting the laser medium to emit a beam of coherent radiation; and (c) mirrors forming an optical resonator for maintaining laser oscillations between the mirrors.

* * * * *

UNITED STATES PATENT AND TRADEMARK OFFICE
CERTIFICATE OF CORRECTION

PATENT NO. : 4,713,820

DATED : December 15, 1987

INVENTOR(S) : Robert C. Morris et al.

It is certified that error appears in the above-identified patent and that said Letters Patent is hereby corrected as shown below:

Col. 1, line 5: Delete "p" before BACKGROUND.

line 38: "$La_{3+}$" should read -- $La^{3+}$ --.

Col. 4, line 62: The formula should read:

-- (5) $\tan^2 \rho = 0.7144/(0.3785 \cos^2 \Phi + 0.1913 \sin^2 \Phi)$ --.

line 63: Insert the formula:

-- (6) $\rho = \arc \tan [(0.7144/(0.3785 \cos^2 \Phi + 0.1913 \sin^2 \Phi)]^{\frac{1}{2}}$ --.

Col. 5, line 16: After thermal add -- lensing. --.

Col. 6, line 8: "varety" should read -- variety --.

line 63: After the word laser delete "that".

Col. 7, line 12: "oscillatios" should read -- oscillations --.

Col. 8, line 1: Add a _comma_ after gadolinium.

line 9: After the word laser delete "that".

line 10: "closer" should read -- laser --.

Signed and Sealed this

Seventh Day of February, 1989

*Attest:*

DONALD J. QUIGG

*Attesting Officer*  *Commissioner of Patents and Trademarks*